United States Patent [19]

Flanagan

[11] Patent Number: 4,653,606

[45] Date of Patent: Mar. 31, 1987

[54] ELECTROACOUSTIC DEVICE WITH BROAD FREQUENCY RANGE DIRECTIONAL RESPONSE

[75] Inventor: James L. Flanagan, Warren, N.J.

[73] Assignee: American Telephone and Telegraph Company, Murray Hill, N.J.

[21] Appl. No.: 714,889

[22] Filed: Mar. 22, 1985

[51] Int. Cl.[4] ................................................ H05K 5/00

[52] U.S. Cl. .................................... 181/145; 181/147; 181/158; 181/160; 381/91

[58] Field of Search ......................... 181/175, 144–147, 181/158, 160; 381/26, 66, 91, 92, 94

[56] References Cited

U.S. PATENT DOCUMENTS

| | | | |
|---|---|---|---|
| 3,204,031 | 8/1965 | Gorike et al. | 381/91 |
| 3,626,365 | 12/1971 | Press | 381/92 X |
| 4,131,760 | 12/1978 | Christensen et al. | 381/66 |
| 4,314,098 | 2/1982 | Maerfield | 181/175 X |
| 4,485,484 | 11/1984 | Flanagan | 381/92 |

OTHER PUBLICATIONS

*The Bell System Technical Journal,* vol. 58, No. 4, Apr. 1979, "Acoustic Filters to Aid Digital Voice", by J. L. Flanagan, pp. 903–944.

*Primary Examiner*—Benjamin R. Fuller
*Attorney, Agent, or Firm*—Jack S. Cubert

[57] ABSTRACT

An electroacoustic device comprises an array of electroacoustic transducer elements for producing a prescribed directional response pattern at a first frequency. Each element includes apparatus for restricting the frequency range of sound waves incident on said element so that the directional response pattern is invariant over a prescribed frequency band.

8 Claims, 7 Drawing Figures

ELECTROACOUSTIC DEVICE WITH BROAD FREQUENCY RANGE DIRECTIONAL RESPONSE

FIELD OF THE INVENTION

My invention relates to apparatus for converting sound waves to electrical signals, and more particularly, to electroacoustic transducers adapted to produce directional response patterns.

BACKGROUND OF THE INVENTION

In systems adapted to transmit or record sounds such as speech or music, it is often necessary to use electroacoustic apparatus that is directional in nature. With such apparatus only sounds emanating from preferred directions are converted into electrical signals while sounds from other directions are attenuated. In teleconferencing, array type microphones may be employed to pick up and transmit speech or other sounds from prescribed directions in large meeting rooms or auditoria so that background noise and extraneous sounds that may interfere with the intelligibility of the desired sounds are removed. Such array microphone structures may exhibit directable beam patterns that focus at talker locations and may be redirected to other points in the room as talker locations change. An arrangement that utilizes beam directional patterns is described in U.S. Pat. No. 4,485,484 issued Nov. 27, 1984.

One problem encountered with array type microphones relates to the modification of the shape of the directional pattern that occurs as the sound wave frequencies increase. As is well known in the art, the physical dimensions of a microphone array become larger compared to a wavelength in the medium as frequency increases. Consequently, the spatial directivity of an array is more acute at higher incident sound frequencies and the directional response pattern narrows with increasing frequency. This effect is especially true for widely utilized uniform arrays. The importnt frequency range of speech signals is generally greater than four octaves and the frequency range of musical sounds is wider. Thus, an array designed to have useful directivity at lower frequencies exhibits substantially more acute and practically less useful directivity at the high end of the sound frequency spectrum.

Prior art directive array microphone arrangements have been designed to provide a prescribed directional response pattern at a particular low range frequency and to provide an effective directional response pattern over a portion of the sound frequency spectrum. At higher frequencies, however, the aforementioned changes in directivity make the directional beam too narrow for practical purposes. As a result, the practically useful directional pattern of the array is only obtained over a limited portion of the audio frequency spectrum. It is an object of the invention to provide an improved electroacoustic transducer array having substantially constant directional response patterns over the audio spectrum.

BRIEF SUMMARY OF THE INVENTION

The aforementioned object is achieved by frequency weighting the response of the elements of the array so that the number of active array elements is selectively reduced as a direct function of frequency. Such frequency weighting may be implemented by relatively inexpensive acoustic filtering at the individual array elements.

The invention is directed to an electroacoustic device comprising a pattern of electroacoustic transducer elements for producing a prescribed directional response pattern. Each element includes apparatus for restricting the frequency range of sound waves incident on said element.

DETAILED DESCRIPTION

Figure 1:
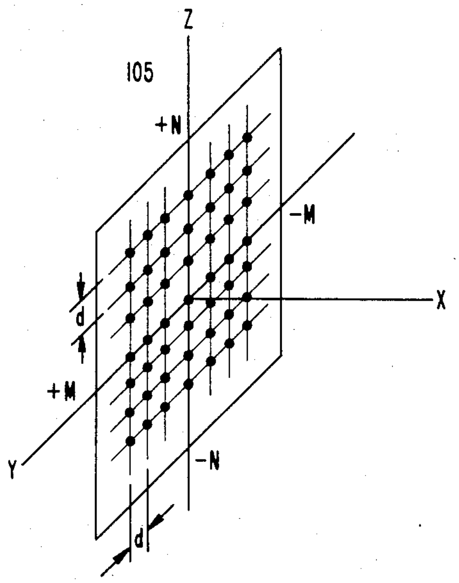
FIG. 1 depicts a two-dimension directional electroacoustic array illustrative of the invention.

An electroacoustic array illustrative of the invention is shown in FIG. 1. The array therein comprises a set of equispaced transducer elements with one element at the center and an odd number of elements in each row M and column N. The elements are spaced a distance d apart so that the coordinates of each element are $$y = md, \; -M \leqq m \leqq M$$

$$z = nd, \; -N \leqq n \leqq N. \qquad (1)$$

where the array is located in the y-z plane as shown. The outputs of the individual transducer elements in the array are summed to produce the overall frequency response $$H(\theta,\phi) = \sum_m \sum_n P(m,n) = \sum_m \sum_n A(m,n)e^{j\omega\tau(m,n)} \qquad (2)$$

In Equation (2) $\theta$ is the azimuthal angle measured from the x axis and $\phi$ is the polar angle measured from the z axis. $\theta$ and $\phi$ define the direction of the sound source. P is the sound pressure at element (m,n), A(m,n) is the amplitude weight and $\tau$(m,n) is the relative transit delay at the m,nth transducer element. A constant delay $\tau_o$ that insures causality is omitted for simplicity. The delay $\tau$(m,n) of course depends upon the sound arrival direction ($\theta$,$\phi$). H($\theta$,$\phi$) is therefore a complex quantity that describes the array response as a function of direction for a given radian frequency $\omega$. Similarly, a particular direction ($\theta$,$\phi$), the frequency response of the array is $$H(\omega) = \sum_m \sum_n A(m,n)e^{-j\omega\tau(m,n)}, \qquad (3)$$

and the corresponding time response to an impulsive source of sound is $$h(t) = \sum_m \sum_n A(m,n)\delta(t - \tau(m,n)) \quad (4)$$

where δ(t) is the unit impulse response function.

If the amplitude weights are all real and equal to unity, i.e., A(m,n)=1, an impulsive plane wave arriving from a direction perpendicular to the array (θ=0, φ=π/2), results in a response $$h(t)_{o,\pi/2}=(2M+1)(2N+1)\delta(t). \quad (5)$$

If the sound is received from any other direction, the time response is a string of (2M+1) (2N+1) impulses occupying a time span corresponding to the wave transit time across the array.

In the simple case of a line array of 2N+1 receiving transducers oriented along the z axis (y=0) in FIG. 1, e.g., line 105, the spatial response as a function of frequency is $$H(\phi) = \sum_n A_n e^{\frac{j\omega nd\cos\phi}{c}}, \ -N \leqq n \leqq N \quad (6)$$

where c is the velocity of sound and $A_n$ is the amplitude weight at the $n^{th}$ array element. Correspondingly, the time response is $$h(t) = \sum_n A_n\delta[t - \tau(n)] \quad (7)$$

where $$\tau(n) = n \cdot \tau = \left[\frac{nd\cos\phi}{c}\right], \ -N \leqq n \leqq N.$$

For amplitude weights equal to unity ($A_n$=1), Equation (7) shows the response to an impulsive plane wave to be a string of impulses equispaced by τ seconds apart and having a total duration of (2N+1) τ, where $\tau=(d\cos\theta)/c$ Alternatively, the response may be described as $$h(t) = e(t) \cdot \sum_{n=-\infty}^{\infty} \delta[t - \tau(n)] \quad (8)$$

where e(t) is a rectangular envelope and $$e(t) = 1, \ -(N + \tfrac{1}{2})\frac{d\cos\phi}{c} \leqq t \leqq \frac{(N + \tfrac{1}{2})d\cos\phi}{c} \quad (9)$$

and zero otherwise. The impulse train is shown in waveform 701 of FIG. 7 and the e(t) window is shown in waveform 703.

The Fourier transform of h(t) is the convolution $$F[h(t)] = H(\omega) = F[e(t)]*F\left[\sum_{n=-\infty}^{\infty} \delta(t) + \frac{nd\cos\phi}{c}\right],$$

where $$F[e(t)] = E(\omega) = \left[\frac{\sin\frac{\omega(N + \frac{1}{2})d\cos\phi}{c}}{\frac{\omega(N + \frac{1}{2})d\cos\phi}{c}}\right]. \quad (10)$$

Figure 7:
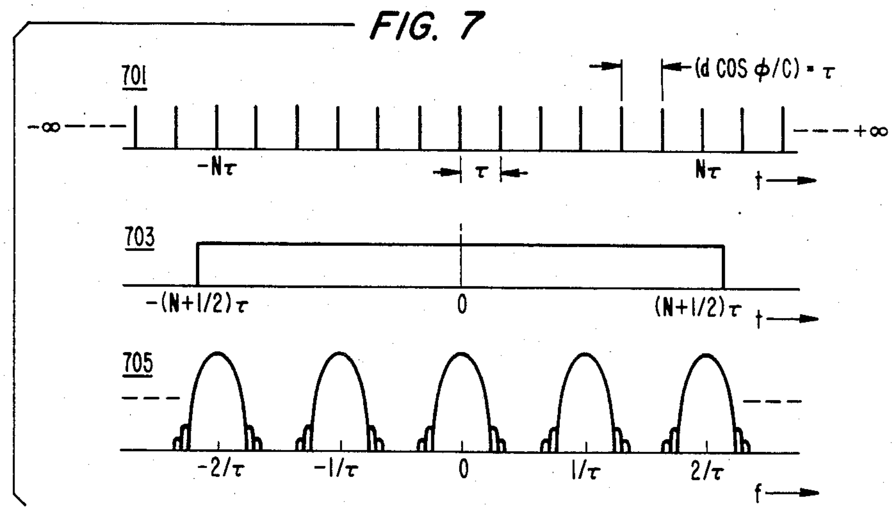
FIG. 7 shows waveforms illustrating the ideal impulse response of the row of elements of FIGS. 2 and 3 when no element filtering is used.

The Fourier transform of e(t) (waveform 703) convolved with the infinite impulse string (waveform 701) is an infinite string of sinx/x functions in the frequency domain, spaced along the frequency axis at a sampling frequency increment of c/d cos φHz as illustrated in waveform 705 of FIG. 7.

The lower bound on the highest frequency for which the array can provide directional discrimination is set by the end-on arrival condition (φ=0) and is c/d Hz. Signal frequencies higher than c/d Hz lead to spatial aliasing in the array output. The lowest frequency for which the array provides spatial discrimination is set by the first zero of the sinx/x term of Equation (10) and is $$\frac{c}{(2N + 1)d} \text{ Hz.}$$

Consequently, the useful bandwidth of the array is $$\frac{1}{(2N + 1)}\left(\frac{c}{d}\right) \leqq f \leqq \left[\frac{2N}{2N + 1}\right]\left[\frac{c}{d}\right]. \quad (11)$$

Figure 4:
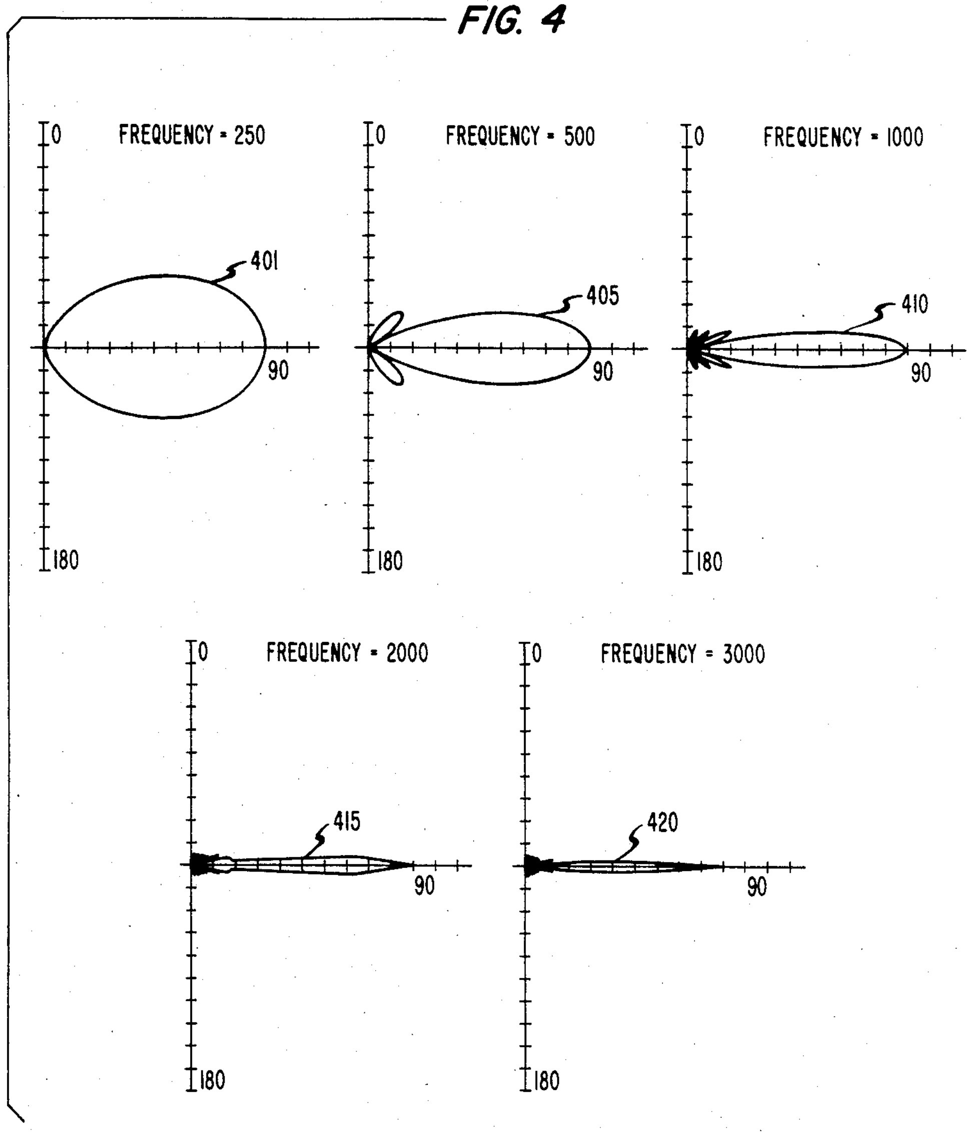
FIG. 4 shows directional patterns illustrating the operation of the row of elements of FIG. 2 where no element filtering is used.

In general, therefore, the element spacing according to the prior art is determinative of the highest frequency for which the array provides spatial discrimination, and the overall dimension (2 Nd) determines the lowest frequency at which there is spatial discrimination. There is, however, considerable variation in the directional response pattern over this frequency range. FIG. 4 shows the response pattern of such an array for which $A_n$ is constant as a function of frequency. Waveform 401, 405, 410, 415 and 420 show the directional response pattern for a line array at incident sound frequencies of 250 Hz, 500 Hz, 1600 Hz, 2000 Hz, and 3000 Hz, respectively. As indicated in FIG. 4, the response patterns become narrower as the incident sound frequency increases. The foregoing is likewise applicable to a two-dimension rectangular array arranged for two-dimensional spatial discrimination, i.e., a cigar-shaped beam, over a prescribed audio frequency range.

A significant improvement in the quality of output from arrays of the type described may be obtained by maintaining the width of the beam constant over the desired audio frequency range. According to the invention, the beamwidth variations are minimized over the desired frequency range by decreasing the size of the array as the incident sound frequency increases. This is achieved in terms of Equation (6) by altering $A_n$ so tht it is a function of frequency $A_n(\omega)$. The same type of frequency dependence can also be introduced for the two-dimensional case, that is, utilizing $A(m,n)=A_{m,n}(\omega)$ in Equation (2). Physically, this is realized by reducing the number of active receiver elements as frequency increases, starting with the extremities of the array.

Figure 3:
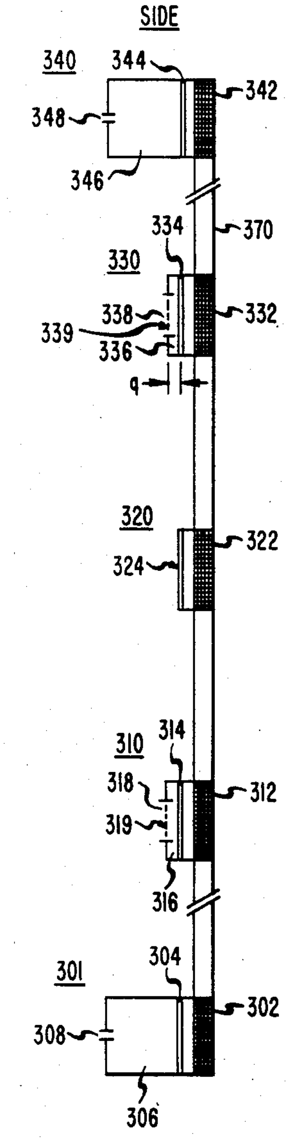
FIG. 3 shows a side view illustrating the detailed construction of the row of elements of FIG. 2.
Figure 2:
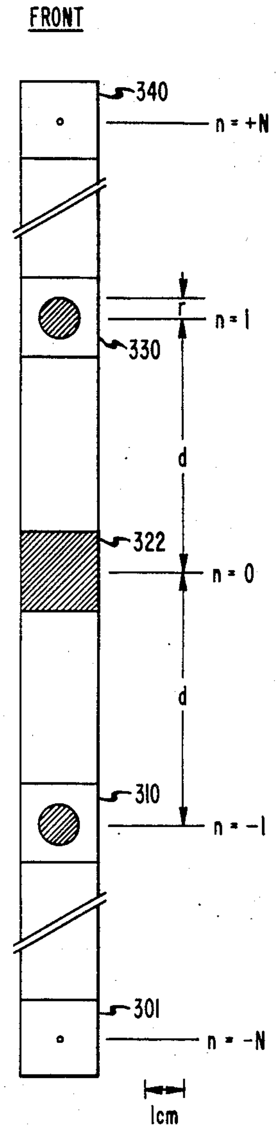
FIG. 2 depicts a front view of a row of electroacoustic elements illustrative of the invention that may be the center row of FIG. 1.

The arrangement to accomplish the reduction is shown for the line array of FIGS. 2 and 3. Each element except the center element has associated therewith a filter adapted to control the frequency range of sound waves applied to that element. The filter characteristic for a conventional inductive, resistive, capacitive (LRC) circuit has the amplitude-versus-frequency behavior described by $$A(j\omega) = \left[ \frac{1}{LC(j\omega)^2 + RC(j\omega) + 1} \right]. \quad (12)$$

This is a second-order circuit whose characteristic equation has one pair of complex-conjugate roots. These roots may be selected with critical damping, so that the response exhibits a smooth −12 db/octave low-pass behavior without a pronounced resonant peak. In this case $R=2(L/C)^{\frac{1}{2}}$. If the resonant elements of this arrangement are selected to be a function of n, the frequency weighting function for each element can be made $$A_n(j\omega) = \left[ \frac{1}{|n|^2LC(j\omega)^2 + 2|n|(LC)^{\frac{1}{2}}(j\omega) + 1} \right]. \quad (13)$$

The function $A_n(j\omega)$ weights the receiver elements by the amplitude factor $A_n(j\omega)$, and the phase factor arg-$[A_n(j\omega)]$.

It is often inconvenient to provide electrical filtering components at each array element and the additional circuitry increases the cost of the array device. While such electrical filtering may be utilized, I have found that the array element filtering may be achieved by providing an acoustic filtering chamber at each element. The techniques disclosed in my article, "Acoustic Filters to Aid Digital Voice", appearing in *The Bell System Technical Journal,* Vol 58, pp. 903–944, may be used to construct such a filtering chamber. The required acoustic inductance (inertance) can be realized by a circular perforation of radius r in a thin plate giving an acoustic inductance of $$L_a=\rho/2r, \quad (14)$$

where $\rho$ is the medium (air) density.

The necessary acoustic compliance (or capacitance) may be supplied by a cavity of volume V=Ag having an acoustic capacity of $$C_a=Aq/\rho c^2, \quad (15)$$

where A is the cross-sectional area of the cavity and q is its length. Acoustic loss $R_a$ can be provided by silk or cotton mesh of appropriate density, and hence flow resistance, covering the aperture. The resulting perforated cavity may be the housing for each microphone element of the array. The resonant frequency of each housing decreases with n, which is proportional to the distance from the array center, and the critical damping is chosen to be independent of n. While any microphone may be used in this array, electret microphones are particularly adapted to such housing arrangements.

The array element row shown in FIGS. 2 and 3 illustrates the acoustical filtering construction. Referring to FIGS. 2 and 3, the array elements are mounted on common plate 370. The transducer of each element is an electret type microphone comprising a backplate, a diaphragm, and an acoustical chamber for restricting the range of sound wave frequencies incident on the electret. Element 320 is the center element of the array and comprises only backplate 322 and diaphragm 324. Element 310 has backplate 312, diaphragm 314 and acoustic chamber 316. Chamber 316 includes aperture 318 which as indicated has screen cover 319. Element 330 on the other side of center element 320 includes chamber 336 with aperture 338, screen cover 339, diaphragm 334 and backplate 332. Both elements 310 and 330 are adjacent to center element 320 and are equidistant therefrom. Consequently, the dimensions of chamber 316 and 336 are the same and apertures 318 and 338 are the same size. The Nth elements located at the extremities of the array are elements 301 and 340.

Element 301 comprises backplate 302, diaphragm 304, acoustic chamber 306, and aperture 308. Similarly, element 340 includes backplate 342, diaphragm 344, chamber 346 and aperture 348. These chambers are equidistant from the array center and have the same dimensions. Since elements 301 and 340 are extreme elements, the cut-off frequencies are much lower than those of less extreme elements. Thus, the dimensions of chambers 306 and 346 are much larger than the dimensions of chambers 316 and 336. The sizes of the chambers are in inverse relation to the distance of the elements from the array center. As a result, the number of active array elements and the effective size of the array becomes smaller as the incident sound wave frequency increases.

Figure 5:
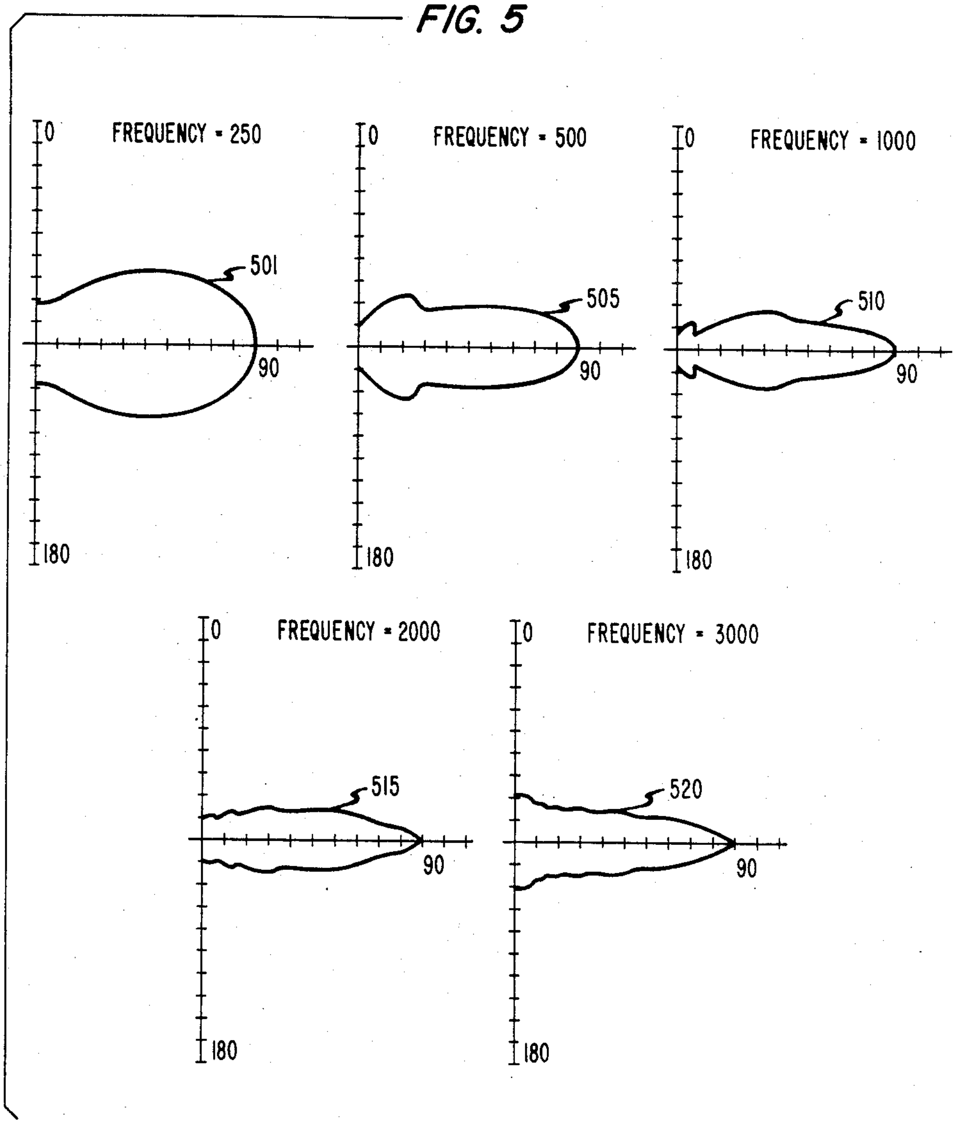
FIG. 5 shows directional patterns illustrating the operation of the row of elements of FIG. 2 where element filtering is used in accordance with the invention.
Figure 6:
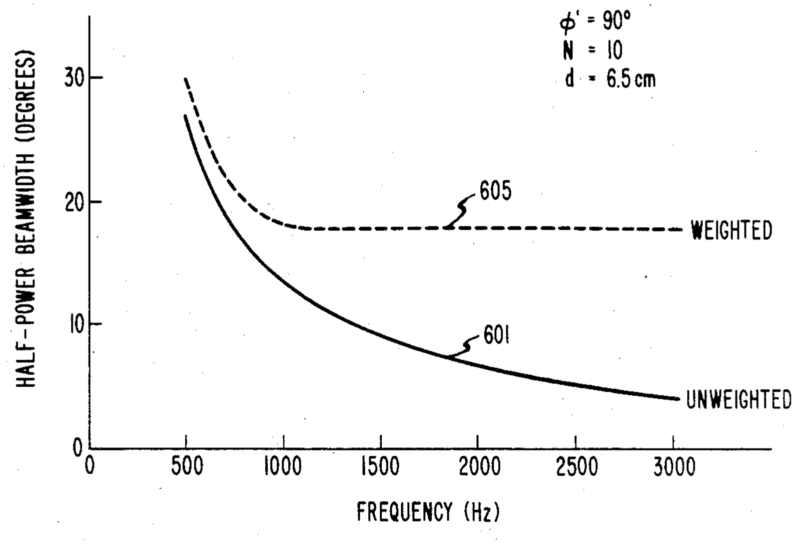
FIG. 6 shows waveforms comparing the directional patterns of FIGS. 4 and 5.

FIG. 5 illustrates the directional response patterns obtained through the use of acoustical filters at the array elements in accordance with the invention. Response 501 shows the directional response pattern for sound waves of 250 Hz applied at varying directions $\theta$ to the line array of FIGS. 2 and 3. Waveforms 505, 510, 515 and 520 illustrate the normalized directional response patterns at sound wave frequencies of 500, 1000, 2000, and 3000 Hz, respectively. It is noted that the magnitude of the response decreases as the number of active elements in the array becomes smaller. An equalizer arrangement connected to the output of the array may be used to compensate for such drop off in amplitude as is well known in the art. In contrast to the directional response curves of FIG. 4, the acoustical filtering shown in FIGS. 2 and 3 results in a substantially invariant beamwidth directional response over the main parts of the audio spectrum important for speech signals. FIG. 6 illustrates the improvement produced by the line array arrangement of the invention. Curve 601 is a plot of the half-power beamwidth in degrees of a prior art array without element frequency weighting. As is evident from FIG. 6, the beamwidth decreases markedly as the incident sound wave frequency increases. Curve 605 is a plot of the half-power beamwidth of an array constructed in accordance with the invention. The half-power beamwidth in curve 605 is substantially invariant above 1000 Hz.

The invention has been described with reference to a preferred embodiment thereof. It is to be understood that various other arrangements and modifications may be made by those skilled in the art without departing from the spirit and scope of the invention. For example, the array may be a single line array, a planar surface array or a non-planar surface array of electroacoustic elements to achieve different directional response patterns. The elements of the array may be microphone elements adapted to receive sound waves or loudspeaker type elements adapted to project sound waves.

What is claimed is:

1. An electroacoustic device comprising:

a plate structure;

an array of electroacoustic elements having a centerpoint mounted on said plate structure, each element being a prescribed distance from the array centerpoint to produce a predetermined directional response pattern;

each electroacoustic element in the array including an electroacoustic transducer and means connected to said transducer for restricting the frequency range of sound waves received by said transducer;

said acoustical frequency restriction means of each element including acoustical filtering means coupling said element electroacoustic transducer to the source of said sound waves for attenuating sound wave frequencies greater than a prescribed frequency incident on said electroacoustic transducer, the prescribed frequency of each array element acoustical filtering means being in inverse relationship to the prescribed distance of the element from said centerpoint.

2. An electroacoustic device comprising:

a plate structure;

an array of electroacoustic elements having a centerpoint mounted on said plate structure, each element being a prescribed distance from the array centerpoint to produce a predetermined directional response pattern;

each electroacoustic element in the array including a microphone and acoustical filtering means connected to said microphone for restricting the frequency range of sound waves received by said microphone;

said acoustical filtering means of each element coupling said microphone to the source of said sound waves attenuating sound wave frequencies greater than a prescribed frequency incident on said microphone, the prescribed frequency of each array element acoustical filtering means being in inverse relationship to the prescribed distance of the element from said centerpoint.

3. An electroacoustic device according to claim 2 wherein said acoustical filtering means comprises a chamber covering said microphone having an opening therein for sound waves to pass, the dimensions of said chamber and said chamber opening being selected to attenuate sound waves higher than said prescribed frequency.

4. An electroacoustic device comprising:

a plate structure;

an array of electroacoustic transducers mounted on said plate structure, said array having a centerpoint and each electroacoustic transducer being spaced a predetermined distance from the array centerpoint to produce a prescribed directional response pattern for sound waves at a first frequency;

acoustical filtering means mounted between each electroacoustic transducer and the atmosphere for restricting the frequency range of the sound waves at said transducer between said first frequency and a prescribed higher frequency.

5. An electroacoustic device according to claim 4 wherein the acoustic filtering means between each electroacoustic transducer and the atmosphere having its prescribed higher frequency inversely related to the distance of said electroacoustic transducer from the array centerpoint.

6. An electroacoustic device according to claim 5 wherein each electroacoustic transducer comprises a microphone; and said acoustic filtering means comprises a chamber connecting said microphone to the atmosphere having an opening therein for sound waves, the dimensions of said chamber and said chamber opening being selected to attenuate sound waves higher than said prescribed higher frequency.

7. An electroacoustic device comprising:

a base plate;

a multidimensional array of regularly spaced elements mounted on said base plate, said array having a centerpoint;

each element comprising an electroacoustic transducer and apparatus for restricting the frequency range of sound waves applied to said transducer;

each element being a predetermined distance from the centerpoint of the array to determine a prescribed directional response pattern at a first frequency; and said frequency restriction apparatus at each transducer comprising acoustical filtering means interposed between said transducer and the atmosphere, said acoustical filtering means being shaped to have an upper frequency cut-off at a second frequency that is in inverse relationship to the predetermined distance of the element from the centerpoint of the multidimensional array whereby said prescribed directional response pattern is substantially the same over a prescribed frequency range.

8. An electroacoustic device according to claim 7 wherein said acoustic filter comprises a chamber attached to said transducer having an opening therein to the atmosphere, the dimensions of said chamber and said chamber opening being selected to attenuate sound waves higher than said second frequency.

* * * * *